(12) United States Patent
Vystavěl et al.

(10) Patent No.: US 10,504,689 B2
(45) Date of Patent: Dec. 10, 2019

(54) METHOD FOR SAMPLE ORIENTATION FOR TEM LAMELLA PREPARATION

(71) Applicant: FEI Company, Hillsboro, OR (US)

(72) Inventors: Tomáš Vystavěl, Brno (CZ); Libor Strakoš, Brno (CZ); Anna Prokhodtseva, Eindhoven (NL); Jaromir Vaňhara, Brno (CZ); Jaroslav Stárek, Hronov (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/851,632

(22) Filed: Dec. 21, 2017

(65) Prior Publication Data

US 2019/0198287 A1    Jun. 27, 2019

(51) Int. Cl.
*H01J 37/20* (2006.01)
*H01J 37/244* (2006.01)
*H01J 37/147* (2006.01)
*H01J 37/28* (2006.01)
*H01J 37/305* (2006.01)
*H01J 37/304* (2006.01)

(52) U.S. Cl.
CPC .......... *H01J 37/20* (2013.01); *H01J 37/1478* (2013.01); *H01J 37/244* (2013.01); *H01J 37/28* (2013.01); *H01J 37/305* (2013.01); *H01J 37/3045* (2013.01); *H01J 2237/1501* (2013.01); *H01J 2237/20207* (2013.01); *H01J 2237/24475* (2013.01); *H01J 2237/2802* (2013.01); *H01J 2237/30455* (2013.01); *H01J 2237/3174* (2013.01); *H01J 2237/31747* (2013.01)

(58) Field of Classification Search
CPC ...... H01J 37/20; H01J 37/1478; H01J 37/244; H01J 37/28; H01J 37/305; H01J 2237/20207; H01J 2237/24475; H01J 2237/2802; H01J 2237/31747
USPC ......... 250/310, 311, 440.11, 441.11, 442.11, 250/443.1
See application file for complete search history.

(56) References Cited

U.S. PATENT DOCUMENTS 6,555,832 B1    4/2003  Ryding et al.
2008/0096359 A1  4/2008  Gupta et al.
(Continued)

OTHER PUBLICATIONS

"Electron channeling contrast imaging—ECCI," Max-Planck-Institut fur Eisenforschung, available at: https://www/mpie.de/3079126/ECCI, 2 pages, retrieved Sep. 27, 2017.
(Continued)

*Primary Examiner* — Nicole M Ippolito
(74) *Attorney, Agent, or Firm* — Klarquist Sparkman, LLP

(57) ABSTRACT

A substrate is alignable for ion beam milling or other inspection or processing by obtaining an electron channeling pattern (ECP) or other electron beam backscatter pattern from the substrate based on electron beam backscatter from the substrate. The ECP is a function of substrate crystal orientation and tilt angles associated with ECP pattern values at or near a maximum, minimum, or midpoint are used to determine substrate tilt. Such tilt is then compensated or eliminated using a tilt stage coupled the substrate, or by adjusting an ion beam axis. In typical examples, circuit substrate "chunks" are aligned for ion beam milling to reveal circuit features for evaluation of circuit processing.

20 Claims, 12 Drawing Sheets

(56) References Cited

U.S. PATENT DOCUMENTS

2012/0298884 A1* 11/2012 Nakajima .............. H01J 37/20
250/453.11
2014/0291511 A1 10/2014 Man et al.

OTHER PUBLICATIONS

Kamaladasa et al., "Basic Principles and Application of Electron Channeling in a Scanning Electron Microscope for Dislocation Analysis," Microscopy: Science, Technology, Applications and Education, pp. 1583-1590 (2010).

Phifer et al., "Site-specific 35-minute TEM-lamella preparation by FIB-SEM," European Microscopy Congress 2016: Proceedings, pp. 370-371 (Dec. 2016).

Schmidt et al., "Computer-Aided Determination of Crystal-Lattice Orientation from Electron-Channeling Patterns in the SEM," *Canadian Mineralogist*, 27:15-22 (1989).

Simkin, "Electron Channeling Contrast Imaging (ECCI) Information," available at: http://www.chems.msu.edu/resources/safety/mse-sops/ECCI, 5 pages (2001).

Extended European Search Report from European Patent Application No. 18211937.0, dated May 20, 2019, 10 pages.

Reimer, "Electron Diffraction Methods in TEM, STEM, and SEM," *Scanning*, 2:3-19 (1979).

\* cited by examiner

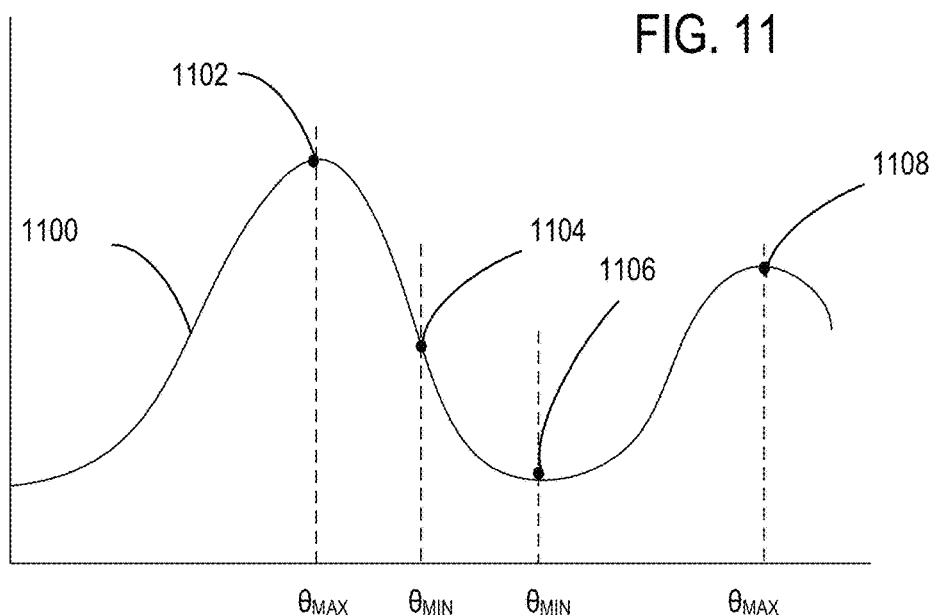

METHOD FOR SAMPLE ORIENTATION FOR TEM LAMELLA PREPARATION

FIELD

The disclosure pertains to sample orientation in electron microscopy.

BACKGROUND

Semiconductor manufacturing processes can take advantage of the high spatial resolution of transmission electron microscopy (TEM) for evaluation of critical dimensions (CDs), defects, process development, and process monitoring. TEM (or STEM) based evaluations generally require preparation of a thin specimen (typically referred to as a lamella). In some cases, ion beam milling is used to obtain a suitable portion of a larger specimen (referred to herein as a "chunk") and the milled chunk is thinned as needed. Automated procedures have been developed for cutting and removing portions (chunks) of a substrate for evaluation. Thinning generally requires precise placement of the chunk so that a surface of interest is perpendicular to an ion beam that is used for thinning. If the sample is not suitably oriented, substrate features at different locations are milled differently. For example, in an SEM image 1400 shown in FIG. 14, substrate features 1402 are associated with appropriate substrate milling, while substrate features 1404 are partially milled through, and their actual shapes and sizes are not readily apparent. Angular alignment requires careful adjustment by an operator. Such alignment therefore is subject to operator error and can be slow, limiting the rate at which thinned lamella are produced. Improved alignment methods and apparatus are needed.

SUMMARY

In some examples, methods comprise directing a charged particle beam to a substrate at a plurality of angles of incidence and detecting portions of the charged particle beam returned from the substrate. Based on the detected portions of the charged particle beam and the plurality of angles, the substrate is aligned with respect to an ion beam axis. In some examples, the substrate is aligned with the ion beam axis by applying a tilt to the substrate, by adjusting the ion beam axis, or both. In these examples, the substrate is typically aligned with respect to the ion beam axis so that a substrate surface facing the ion beam axis is perpendicular to the ion beam axis. In any of the above methods, the charged particle beam can be an electron beam, the detected portions of the electron beam are backscattered portions, an electron channeling pattern is produced based on the detected portions, and the substrate is aligned based on the electron channeling pattern. In these methods, the substrate can be aligned based on a maximum in the electron channeling pattern. In these disclosed methods, the substrate can be secured to a tilt stage and the charged particle beam directed to the substrate at the plurality of angles of incidence by varying a substrate tilt with the tilt stage. Alternatively or in addition, the charged particle beam can be directed to the substrate at the plurality of angles of incidence by varying an axis of the charged particle beam. The disclosed methods can also include ion beam milling the aligned substrate.

Charged particle beam (CPB) apparatus comprise a tilt stage and a specimen mount coupled to the tilt stage and situated to secure a specimen. A charged particle beam (CPB) source is situated to direct a CPB to the specimen and a CPB detector is situated to receive portions of the CPB backscattered from the specimen. A controller is coupled to at least one of the tilt stage and the CPB source so as to vary an angle of incidence of the CPB with respect to the specimen, and determine a tilt of the specimen based on the backscattered portions of the CPB associated with the angles of incidence. The apparatus can also include an ion beam source, wherein the controller is further configured to adjust at least one of an ion beam axis and a specimen tilt based on the determined specimen tilt. In these apparatus, the CPB can be an electron beam and the detected portions of the CPB can be processed by the controller to produce an electron channeling pattern. Tilt of the specimen is then determined based on the electron channeling pattern. In further examples of the above apparatus, the ion beam source includes an ion beam deflector, wherein the specimen tilt with respect to the ion beam is adjusted based on a beam deflection of the ion beam. In additional examples, the controller is coupled to the tilt stage to align a substrate surface to be perpendicular to the ion beam axis. In other examples, the controller is coupled to the tilt stage to vary a specimen tilt about two orthogonal axes and receive signals associated with the corresponding backscattered portions of the electron beam. Typically, the ion beam source is a focused ion beam source. In still other embodiments, the controller determines the tilt of the specimen based on an electron channeling pattern produced with the backscattered portions of the CPB such as a portion of the electron channeling pattern that includes CPB backscatter as a function of a tilt angle about a single axis or as a function of a tilt angle about two axes. In these apparatus, the controller can determine the tilt of the specimen based on a maximum backscattered electron beam intensity in the single axis portion of the electron channeling pattern.

One or more computer readable media are disclosed having defined therein processor-executable instructions for performing a method that includes directing an electron beam to a substrate so as to be incident to the substrate at a plurality of angles of incidence and obtaining associated backscattered electron beam intensities. The backscattered electron beam intensities are processed to produce an electron channeling pattern (ECP). Based on the ECP, the substrate is aligned with respect to an ion beam axis. In typical examples, an ion beam source directs an ion beam along the ion beam axis to thin the substrate.

The foregoing and other objects, features, and advantages of the disclosed technology will become more apparent from the following detailed description, which proceeds with reference to the accompanying figures.

BRIEF DESCRIPTION OF THE DRAWINGS

FIG. 11 illustrates a portion of an ECP along an axis for use in specimen tilt adjustment.

DETAILED DESCRIPTION

Figure 1:
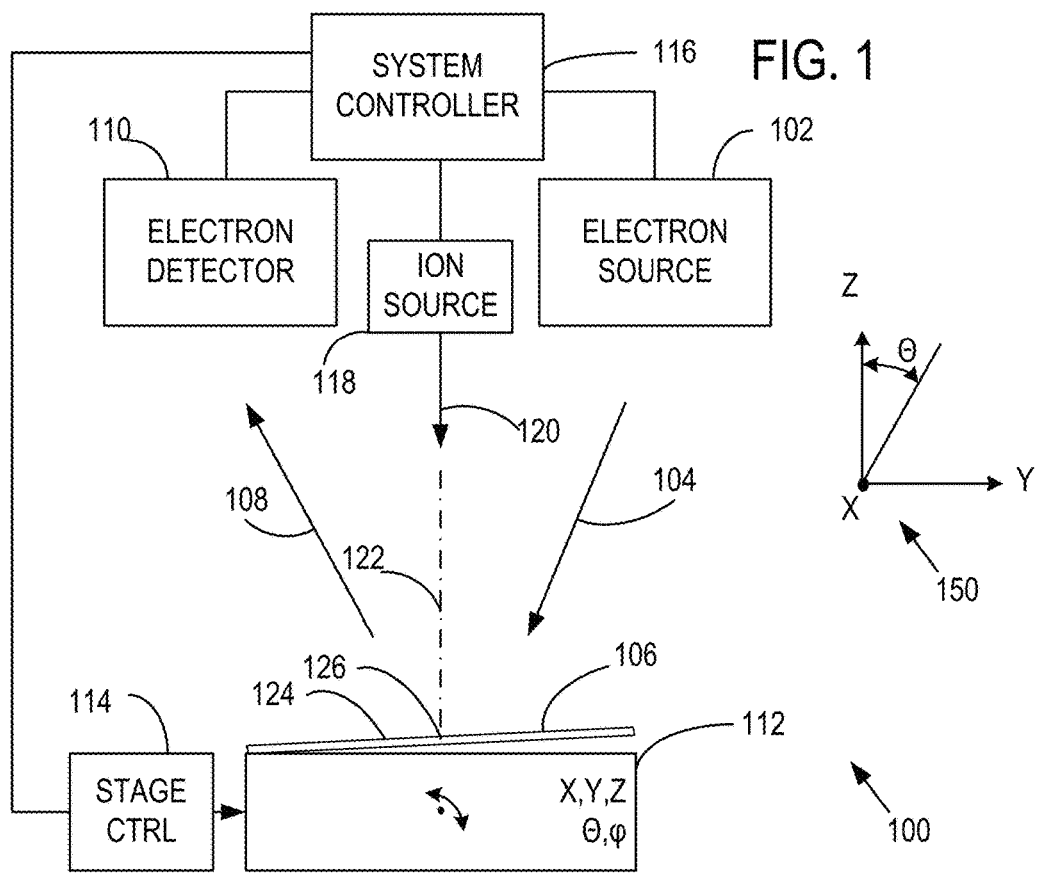
FIG. 1 illustrates a representative ion beam milling system in which a substrate chunk is angularly aligned based on electron back scatter from the substrate chunk.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation. In typical examples, the disclosed methods permit alignment of a substrate for evaluation or processing. As used herein, "aligning" refers to adjusting an angular orientation between a substrate or other specimen and an axis associated with substrate processing or inspection. In some examples, a specimen tilt or rotation is adjusted so that a specimen surface faces a particular direction. For example, the specimen can be adjusted so that an axis perpendicular to a specimen surface (i.e., a surface normal) becomes parallel to or more parallel to a preferred direction, such as along an axis of an ion beam source. However, specimen surfaces can be adjusted to face in various other directions as preferred by a particular application. In addition, alignment can include adjustment of an axis associated with an ion beam source or an imaging system such as an SEM or STEM using one or more charged-particle beam optics or beam deflectors. In other examples, beam axes and specimen tilts can both be adjusted for alignment. In the disclosed examples, a specimen surface normal is generally aligned to become parallel or more parallel to an SEM, STEM, or other imaging system axis, or an ion beam axes. As used herein, axis are perpendicular or parallel if within ±5 degrees, ±3 degrees, ±1 degree, ±0.5 degrees, ±0.2 degrees, or ±0.1 degrees of perpendicular or parallel.

In the disclosed examples, backscattered portions of charged particle beams (CPBs) are detected and used for substrate alignment. Such backscattered portions are detected with one or more CPB detectors to produce associated electrical signals that can be used for display, stored for subsequent use, or processed to produce an electron channeling pattern (ECP). Such electrical signals and the associated backscattered CPB portions (and recorded values stored in a non-transitory computer-readable media) are referred to as intensities, backscattered intensities, currents, or signals, and the exact meaning will be apparent to one of ordinary skill in the art based on the context.

Disclosed herein are methods and apparatus that permit automatic or user-assisted substrate or lamella orientation, particularly for application to substrate thinning. Such methods and apparatus can compensate errors arising in preparation of a substrate chunk, lift out of the chunk, welding or other attachment to a grid or other substrate support. In some examples, backscattered electrons are detected to obtain a portion of an ECP and features of the ECP (maxima, minima, or intermediate value portions) are used to estimate tilt angles about one or more axes and permit tilt angle adjustments. Such tilt angle adjustments can be estimated with chunks mounted to chunk holders, chunks prior to mounting, substrates, or other samples or sample portions. After tilt alignment, chunks or other specimens can be thinned using an ion beam or other process. The disclosed methods can take advantage of substrate crystalline properties, and satisfactory alignment can be achieved for substrates and chunks that have not been processed to define circuit structures.

FIG. 1 illustrates a representative ion beam thinning apparatus 100 that includes an electron source 102 that directs an electron beam 104 to a specimen 106. Portions of the electron beam 104 are backscattered from the specimen 106 to form a backscattered electron beam 108 that is directed to an electron detector 110. Intensity of the backscattered electron beam 108 is dependent on specimen tilt angles with respect to the incident electron beam 104 and crystallographic orientation of the specimen 106. Suitable specimen materials for alignment include crystalline semiconductor materials such as Si, GaAs, InP, and Ge, but other crystalline materials can be used.

The specimen 106 is retained by a multi-axis stage 112, shown in FIG. 1 as providing linear translations along orthogonal X, Y, Z axes of a coordinate system 150 and rotations θ from the Z-axis and φ in the XY plane, wherein the X-axis is perpendicular to the plane of FIG. 1. The angles θ and φ can be referred to as a polar angle (or elevation) and an azimuthal angle, respectively. The coordinate system 150 is provided for convenient illustration and is shown as right-handed spherical coordinate system, but rotations can be specified in other ways, and other coordinate systems can be used as may be convenient. One or more single axis stages can be used, and it is generally unnecessary to provide arbitrary substrate rotations and translations. Alternatively, the stage 112 can be arranged to provide tilts about the X-axis and the Y-axis.

The multi-axis stage 112 is coupled to a stage controller 114 that can include one or more piezoelectric positioners, linear motors, or other drive mechanisms. In some examples, some portions of necessary drive electronics are included as well. A system controller 116 is in communication with the stage controller 114 to initiate stage rotations and translations. In addition, the system controller 116 is coupled to the electron detector 110, the electron source 102, and an ion source 118 to regulate electron beams, ion beams, and acquisition of signals associated with backscattered electrons. In addition, the system controller 116 can be coupled to electron beam and ion beam optical systems and components such as lenses and beam deflectors so that electron and ion beam shapes, positions, and currents can be selected. Detected backscattered electrons can be used to form substrate images, diffraction patterns, or electron channeling patterns that can be presented on a display device, recorded for storage in a memory such as RAM or other storage device.

As shown in FIG. 1, the ion source 118 is situated to direct an ion beam 120 along an axis 122 to a surface 124 of the substrate 106. Typically, the ion beam 120 is controlled to mill selected portions of the substrate 106 to produce portions (typically referred to as "chunks") that can be removed for further investigation or to thin existing chunks. In order to produce satisfactory results, the ion beam 120 is directed to the substrate surface 124 at a selected angle of incidence. In typical examples, the axis 122 of the ion beam is preferably perpendicular to the surface 124 during milling so that the substrate 106 is uniformly thinned.

In operation, the system controller 116 directs the stage controller 114 to vary one or both of the tilt angles θ, φ while the electron detector 110 produces an associated electrical signal that is typically digitized and stored based on backscattered electron current as a function of one or both of these angles. Typically, variation of the polar angle is more important in aligning the substrate 106 with respect to the ion beam 120. It is generally convenient to situate a region of interest (ROI) 126 of the substrate 106 eucentrically so that variations in tilt angle do not displace the ROI 126 with respect to the axis 122. Such positioning is not required, however. In other examples, the angle of incidence of the input electron beam 104 can be varied, and backscattered electron beam current as a function of angle detected and stored. Variation of the polar angle may require one or more tilt stages as tilt angle is not necessarily limited to rotations that remain in a particular plane. In many examples, a rotation of the substrate 106 about the Z-axis produces backscatter signal variation corresponding to a small circle inside a first maximum of an ECP pattern, and may not intersect ECP pattern maxima or minima, and tilts of the surface 124 with respect to the Z-axis (i.e., rotations about the Y-axis and the X-axis are used). If a single tilt and a single rotation are used, a series of tilts is done about one axis, and then a rotation (such as a 90 degree or other rotation) is performed, and then another tilt series is done.

Figure 2:
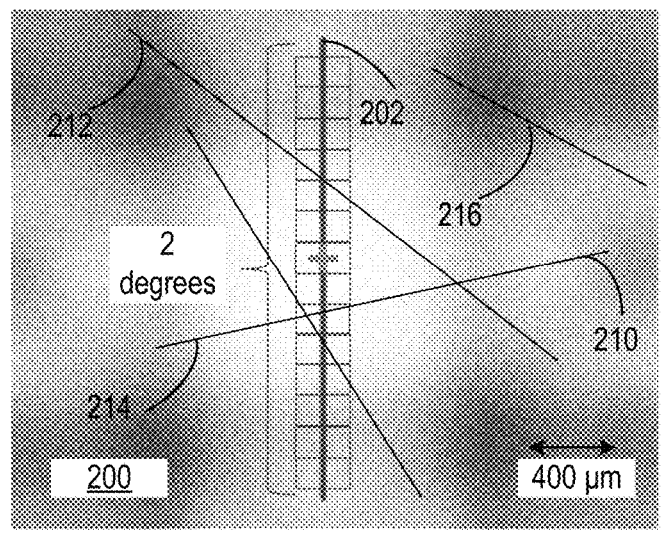
FIG. 2 illustrates a portion of an electron channeling pattern (ECP) with markings corresponding to 0.1 degree tilt increments.

A backscattered electron current as a function of angle can be displayed as an image 200 (an electron channeling pattern) shown in FIG. 2. The image 200 is marked to include a reference grid to illustrate variation in backscattered electron current as a function of angle over a 2 degree angular range. Variations in beam current as a function of angle and portions of a pattern are apparent. These variations in beam current can be used to align a substrate surface with respect to an ion beam for processing. In an example as discussed below with reference to FIG. 3, portions along an axis 202 are used, but portions along other axes such as axes 210, 212, 214, 216 can be used, and a selected axis need not pass through a central maximum.

Figure 3:
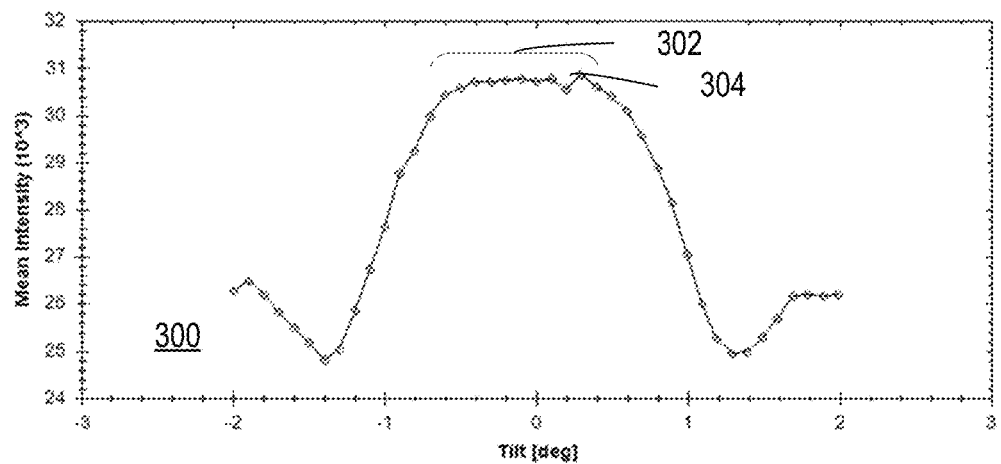
FIGS. 3-4 illustrate backscattered electron intensity as a function of specimen tilt angle based on a portion of an ECP.

A representative graph 300 of backscattered electron intensity as a function of tilt angle is shown in FIG. 3 for a silicon specimen. Based on the graph 300, a tilt angle of the silicon specimen can be selected. While it can be convenient select tilt angle to correspond to an angle of maximum backscatter, angles associated with minimum or intermediate values can be selected depending on orientation of specimen crystal class and orientation of crystallographic axes with respect to a specimen surface. For typical silicon semiconductor substrates, a substrate surface is suitably aligned as situated at a tilt angle associated with a maximum electron backscatter.

In the example of FIG. 3, a peak region 302 contains one or more values that could result in a peak being imprecisely identified, but such errors can be avoided by smoothing peak values, using a midpoint (such as at a full width at half maximum), averaging adjacent values, or by other approaches. Even if a local peak such as local peak 304 were selected for determining a preferred rotation of a substrate, substrate alignment can be based on such a local peak.

Figure 4:
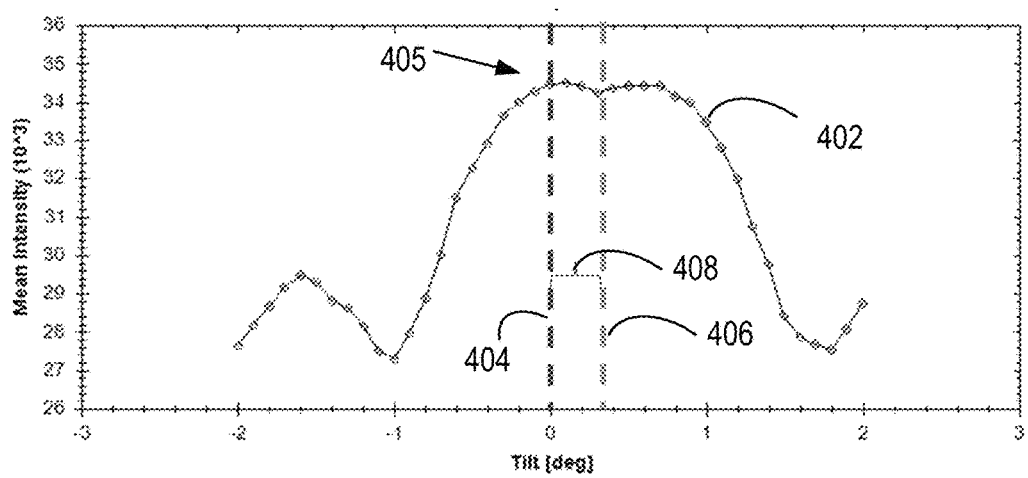

FIG. 4 illustrates specimen alignment using electron backscatter. A backscatter intensity versus tilt curve 402 is shown with an initial "0" degree tilt at 404 as situated by an operator or technician. As is apparent, the initial tilt does not align the specimen so as to be associated with a center of the tilt curve 402 corresponding to a center of the peak region. Application of a tilt to the substrate corresponding to an angle 408 can be used to better align substrate crystalline axes and the specimen surface with respect to an ion beam or electron beam. As shown, a tilt at 406 represents superior alignment.

Crystalline substrate orientations can be conveniently described with reference to Miller indices. For example, for silicon substrates, typically substrate surfaces correspond to (100) or (111) faces. In some cases substrates such as semiconductor wafers include a flat portion at a perimeter to indicate wafer orientation with respect to crystalline axis. Alignment of a substrate surface while on a substrate stage based on such a wafer shape permits alignment of the substrate with respect to an ion beam with a rotation in a single plane. Orientations of other substrates such as those of II-VI and III-V materials can be specified using Miller indices as well. With a given substrate orientation and material, an electron backscatter pattern (such as an electron channeling pattern) can be used to establish orientation, and is typically a function of crystal axis directions in a substrate.

Figure 5:
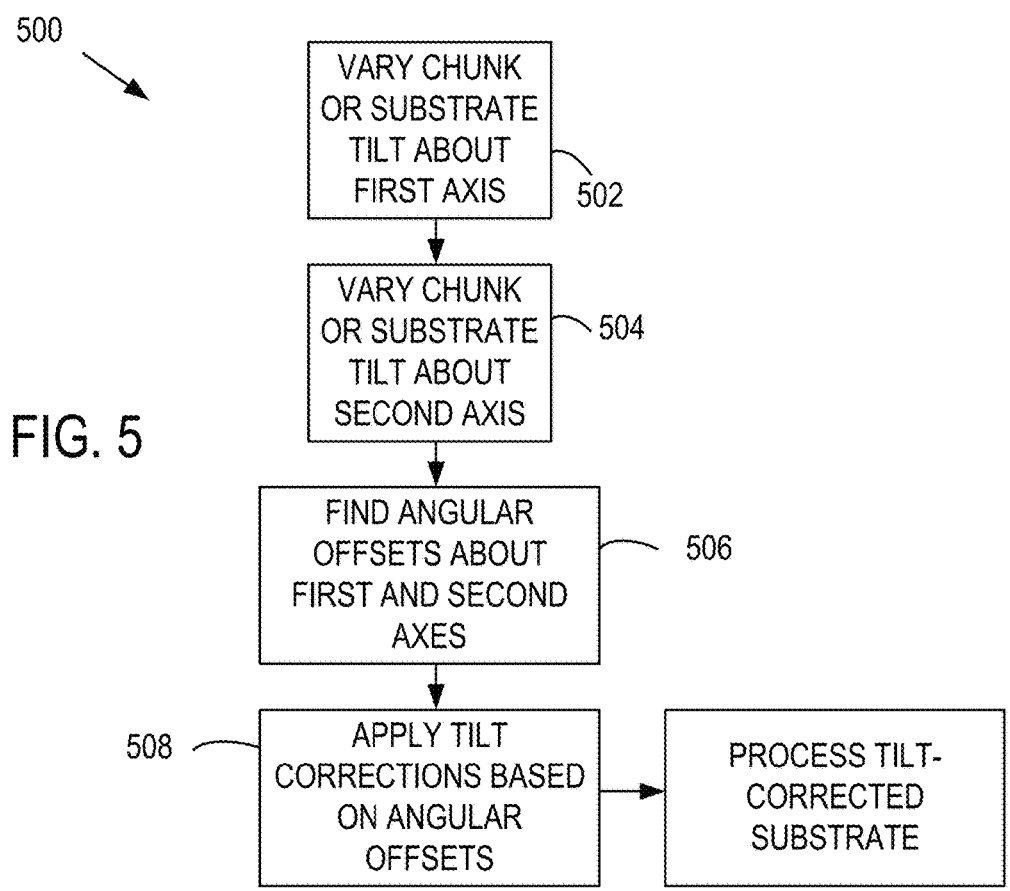
FIG. 5 illustrates a representative method of aligning a substrate chunk using an ECP.

A representative method 500 is illustrated in FIG. 5. At 502, a tilt of a substrate, chunk, or other sample is varied about a first axis and electron backscatter recorded. At 504, a tilt about a second axis is varied and electron backscatter is recorded. At 506, angular offsets of electron backscatter with respect to a selected pattern intensity are determined. At 508, tilt corrections are applied based on the determined angular offsets, and processing such as focused ion beam milling is initiated at 510.

Figures 6A, 6B, 6C:
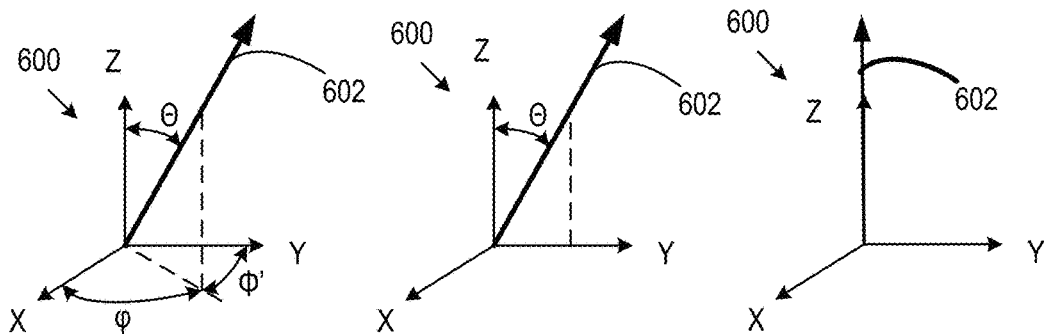
FIGS. 6A-6C illustrate representative tilts and rotations used to obtain an ECP.

Suitable tilts of a substrate may be applied using various combinations of stages in order to acquire electron backscatter data and to adjust substrate angle based on the electron backscatter data. For example, referring to FIGS. 6A-6C, a substrate having a surface normal 600 is situated with a polar angle θ and an azimuthal angle φ with respect to a coordinate system 600. As shown in FIG. 6A, the azimuthal angle φ can be varied and electron backscatter data acquired so that the surface normal 602 can be rotated into a YZ-plane. After such a rotation, as shown in FIG. 6B, the polar angle θ can be varied and electron backscatter data acquired so that the surface normal 602 can be aligned along an ion beam axis, such as the Z-axis as shown in FIG. 6C. The acquired electron backscatter data permits establishing other alignments of a substrate surface as well, but for substrate etching, alignment along an ion beam axis is preferred but an ion beam axis need not be the Z-axis of FIGS. 6A-6C. Thus, as a result of varying the azimuthal angle φ and the polar angle θ and processing associated electron backscatter data, the surface normal 600 can be set to a selected orientation.

Figures 7A, 7B, 7C:
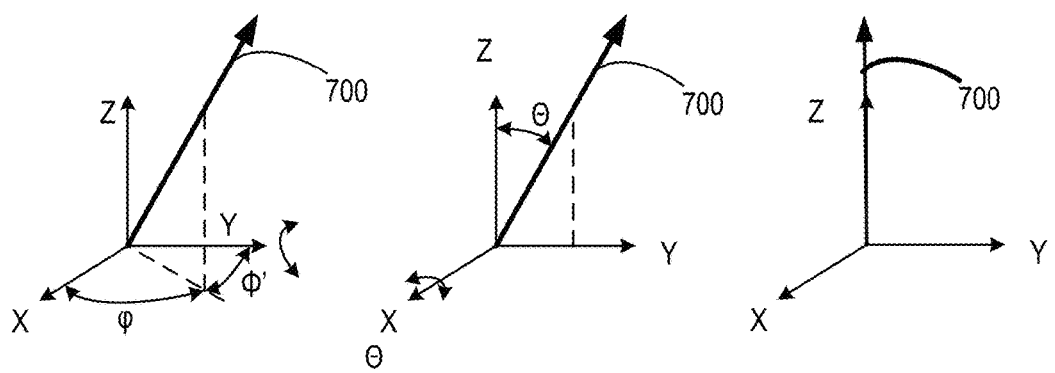
FIGS. 7A-7C illustrate additional representative tilts and rotations used to obtain an ECP.

Suitable tilts may also be applied as illustrated in FIGS. 7A-7C to align a surface normal 700. As shown in FIG. 7A, a substrate rotation about a Y-axis is applied, and electron backscatter data acquired. A rotation about an X-axis is applied as shown in FIG. 7B, and electron backscatter data acquired. Alternatively, rotations about the Y-axis and X-axis can be applied at the same time, interleaved, or otherwise acquired, and need not be acquired sequentially. Based on the acquired electron backscatter data, the substrate can be tilted or rotated so that the surface normal 700 can be aligned as intended, for example, aligned parallel to the Z-axis as shown in FIG. 7C, but the substrate can be arbitrarily aligned based on the electron backscatter data.

In FIGS. 6A-7C, substrate stages that provide two substrate angular adjustments are used, but additional tilt or rotation stages can be used. If substrates tend to have tilts that are in a common plane (with other tilts small or inconsequential), a substrate stage that provides a single angular adjustment can be used.

Figure 8:
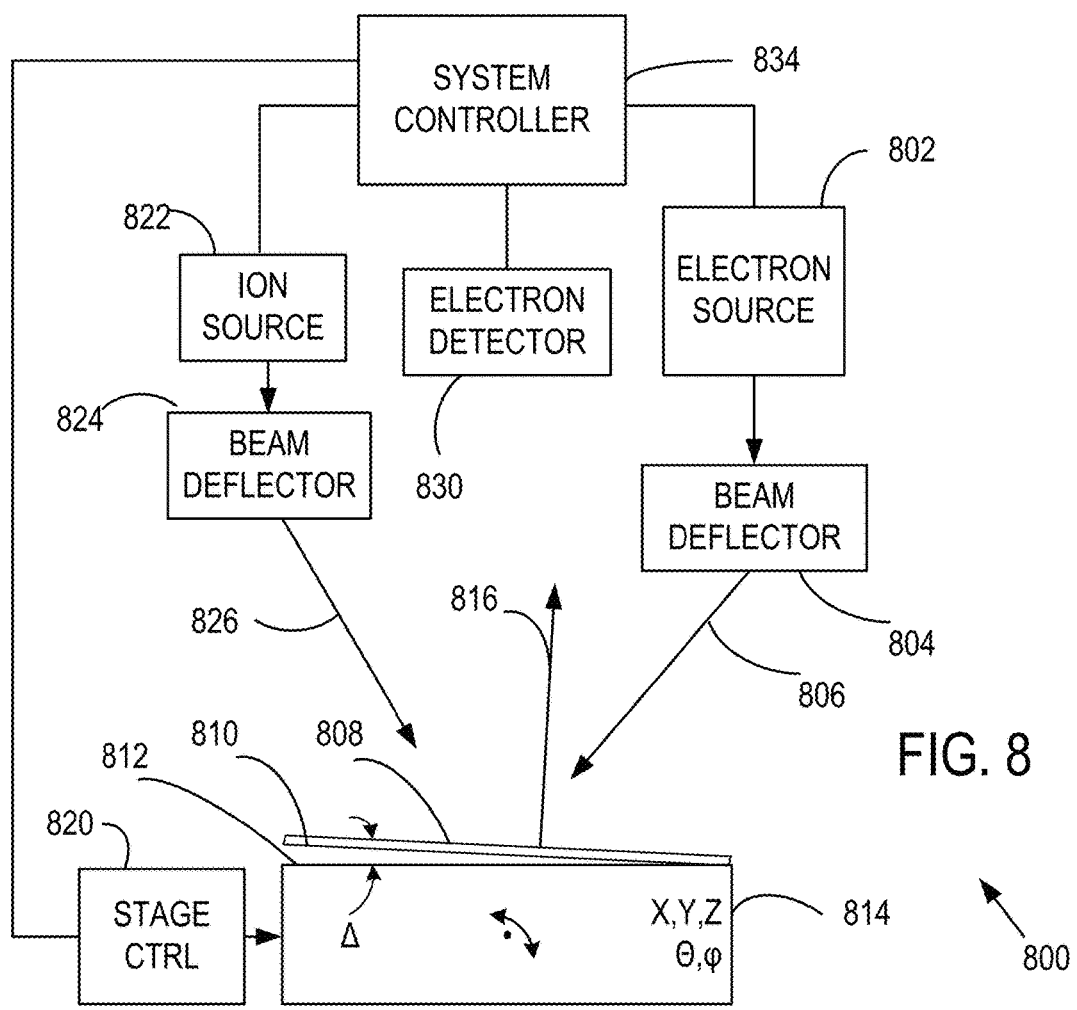
FIG. 8 illustrates a representative ion beam milling system in which a substrate chunk is angularly aligned based on electron back scatter from the substrate chunk, and one or both of an ion beam axis and an electron beam axis can be varied with suitable beam deflectors.

Referring to FIG. 8, an ion beam milling apparatus 800 includes an electron beam source 802 that directs an electron beam to a beam deflector 804 to produce a scanned electron beam 806 that is directed to a surface 808 of a substrate 810. As shown in FIG. 8, the substrate 810 is tilted at an angle Δ with respect to a mounting surface 812 of a substrate stage 814 which can provide multi-axis translations and rotations. Thus a surface normal 816 is not perpendicular to the mounting surface 812, and in most cases, the precise direction of the surface normal 816 varies for different substrate samples. The substrate stage 814 is coupled to a stage controller 820 to adjust substrate stage position and angles. An ion beam source 822 is situated to direct an ion beam to a beam deflector 824 to produce a scanned ion beam 826. An electron detector 830 is situated to receive backscattered portions of the scanned electron beam 806. Beam currents, beam scanning, and substrate stage adjustments are determined with a system controller 834 which also receives electron backscatter signals from the electron detector 830 and processes the electron backscatter signals to establish and adjust substrate tilt.

In operation, the ion beam milling apparatus 800 is used to apply the scanned electron beam 806 to the surface of the substrate at a variety of angles so that measurements of electron backscatter can be used to determine electron backscatter patterns which are processed at the system controller 834 to determine the orientation of the surface normal 816 or other indication of the tilt of the surface 808 of the substrate 810. Upon determining the tilt of the surface normal 816, one or more of the substrate stage 814 and the beam deflector 824 are adjusted so that an ion beam 826 is directed to the substrate 810 along a suitable axis, typically parallel to the surface normal 816.

Figure 9:
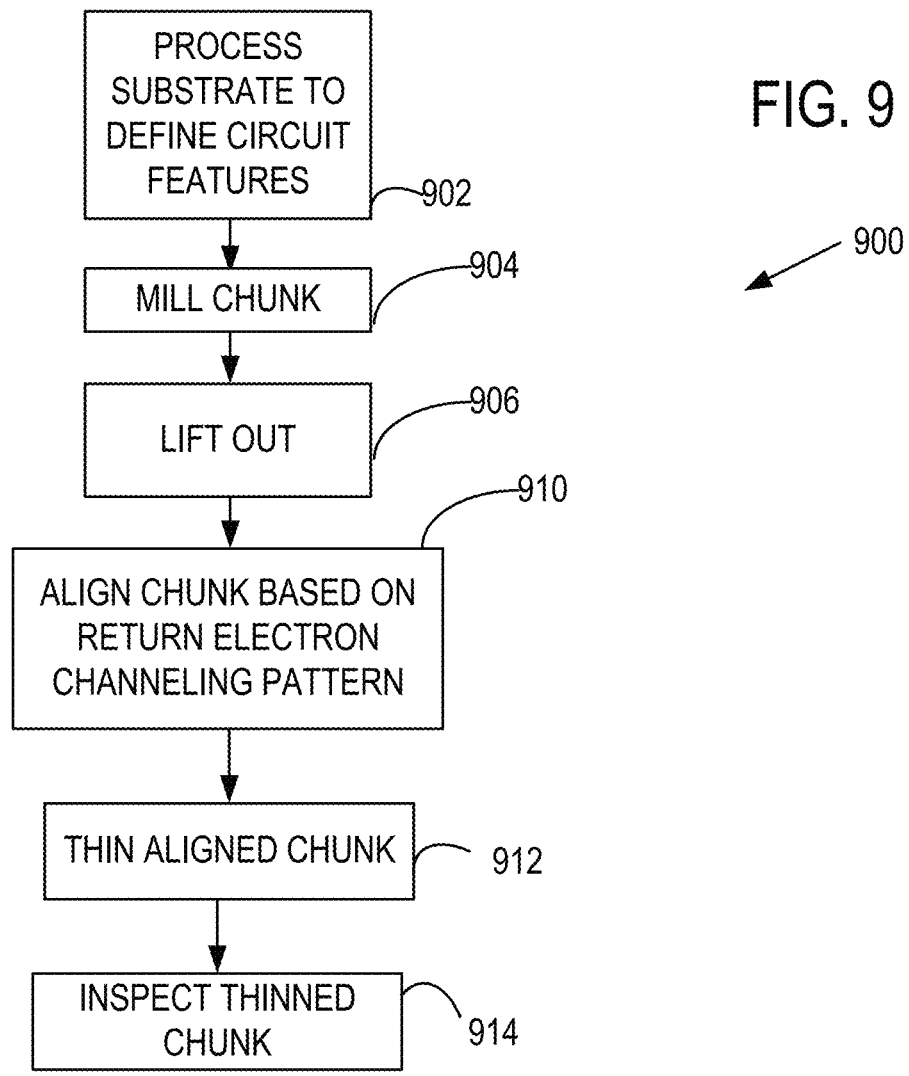
FIG. 9 illustrates a representative method of specimen evaluation in a charged particle beam (CPB) microscope.

With reference to FIG. 9, a representative method 900 includes processing a substrate at 902 to form one or more structures for a circuit to be defined in the substrate. At 904, a "chunk" of the substrate is milled and removed from the substrate at 906. At 910, the "chunk" of the substrate is aligned as discussed above using an electron channeling pattern or other electron backscatter pattern. At 912, the chunk is ion beam milled to permit evaluation of the defined structures, and at 914, the milled chunk is inspected with an electron microscope such as a scanning transmission electron microscope (STEM), a scanning electron microscope (SEM), or other charged particle microscope.

Figure 10:
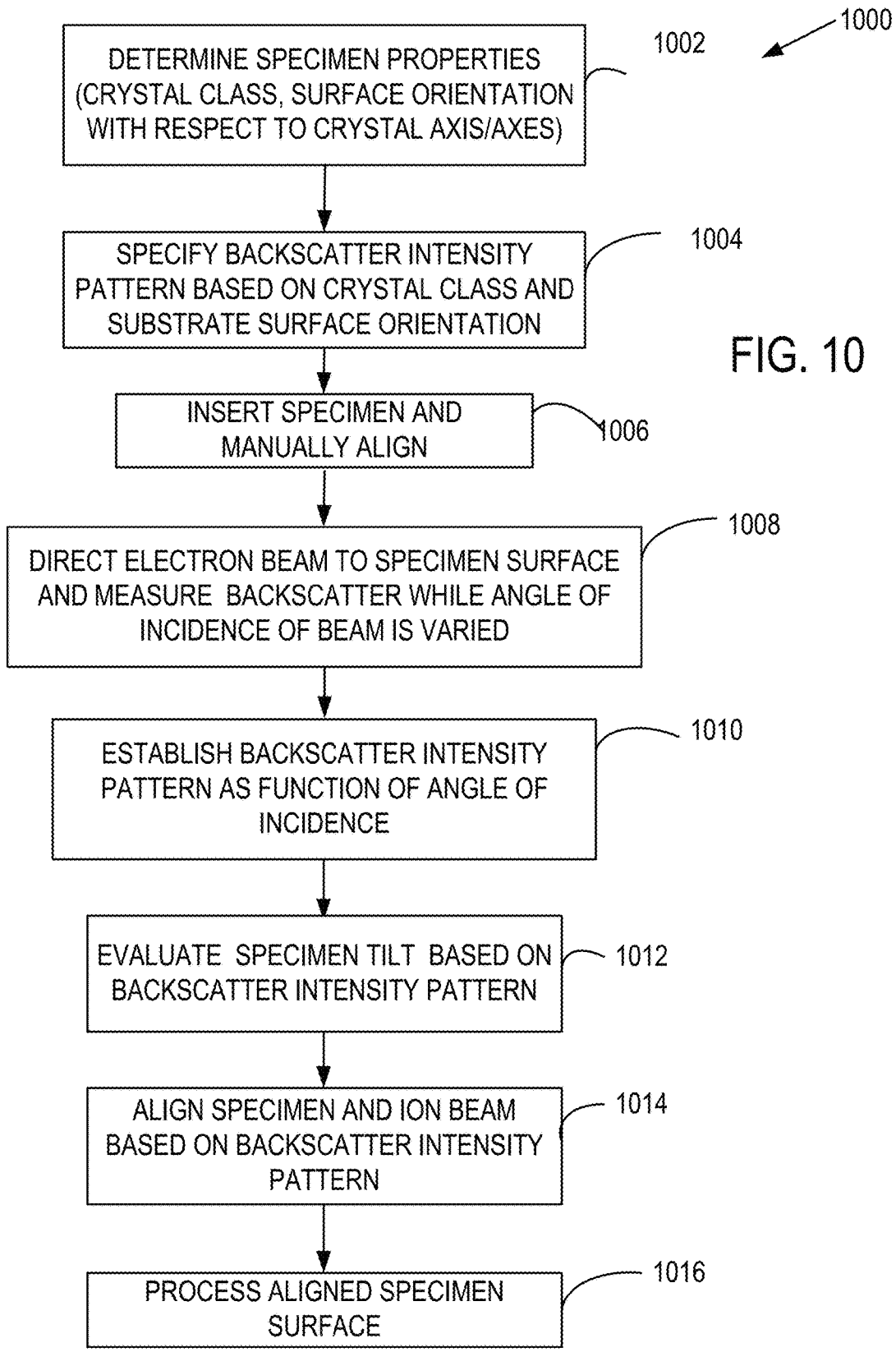
FIG. 10 illustrates another representative method of specimen tilt alignment based on an ECP or other CPB backscatter.

In a further method 1000 illustrated in FIG. 10, at 1002, specimen properties such as crystal class and surface orientation with respect to one or more crystal axes are determined at 1002 and one or more associated electron backscatter patterns are specified at 1004. At 1006, a representative specimen is situated in a suitable electron/ion beam system for evaluation. An electron beam is directed to the specimen at a variety of angles of incidence and electron backscatter measured at 1008. Variation in angle of incidence can be obtained by varying a propagation direction of an electron beam, tilting and/or rotating the specimen, or a combination thereof. At 1010, an electron backscatter pattern is established along at least one axis based on the measured electron backscatter. The electron backscatter pattern is used at 1012 to evaluate specimen orientation, and the specimen is then aligned as needed at 1014. At 1016, the aligned specimen is processed or further evaluated.

FIG. 11 illustrates a representative curve 1100 of electron beam backscatter intensity for tilts of a specimen with respect to an electron beam about a single axis. Such a curve can be obtained from an ECP associated with tilts about two or more axes, or an ECP based on tilts about a single axis. Specimen orientation can be determined using various portions of the curve 1100. For example, relative maxima 1102, 1108 can be found and the associated angles established as an estimate of specimen orientation. Relative mimima such as minimum 1106 can be used as well. Intermediate values such as 1104 can be used. While any value on the curve 1100 can be used, a location as which a curve slope is at or near a maximum slope can produce superior estimates of substrate tilt.

Figure 12A:
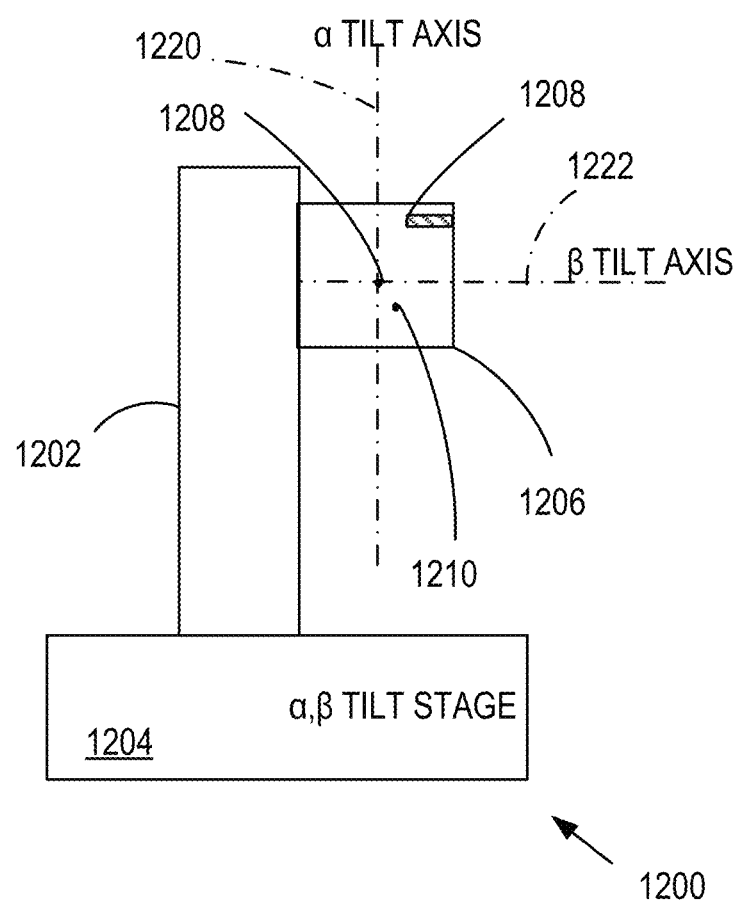
FIG. 12A illustrates a specimen "chunk" that is tiltable based on backscattered portions of an electron beam.

Referring to FIG. 12A, a substrate alignment system 1200 includes a substrate support 1202 such as a portion of a TEM grid that is coupled to a two-axis tilt stage 1204. A specimen (typically a "chunk") 1206 is secured to the tilt stage 1204 that can then provide tilts of the chunk 1206 about an axis 1220 (α tilt) and an axis 1222 (β tilt). A region 1210 associated with a center or other preferred location need not be at an intersection of the axes 1220, 1222. A circuit or other structure 1208 is included in the chunk 1206. After alignment, the chunk 1206 can be ion beam milled to reveal features of the circuit structure 1208.

Figure 12B:
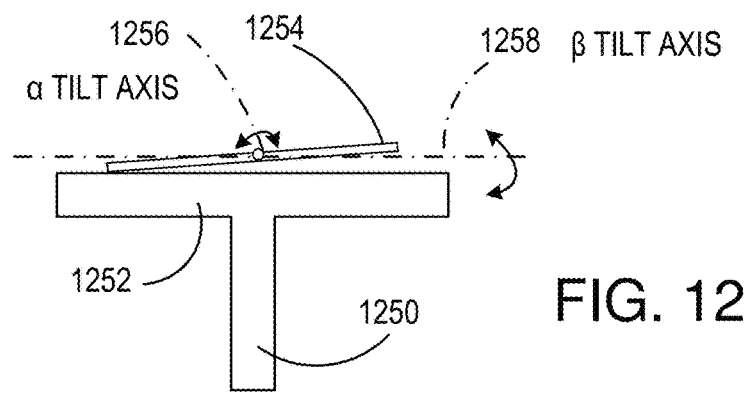
FIGS. 12B-12C illustrate representative mounting arrangements for substrate chunks.
Figure 12C:
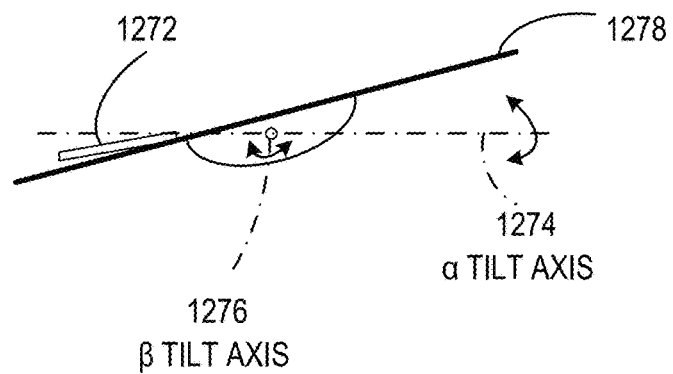

FIGS. 12B-12C illustrate additional chunk mounts. As shown in FIG. 12B, a chunk 1254 is secured to an end portion 1252 of a stub 1250. The chunk is rotatable about axis 1256, 1258 for alignment. As shown in FIG. 12C, a substrate 1272 is secured to a grid 1278 that is rotatable about axes 1274, 1276.

Figure 13:
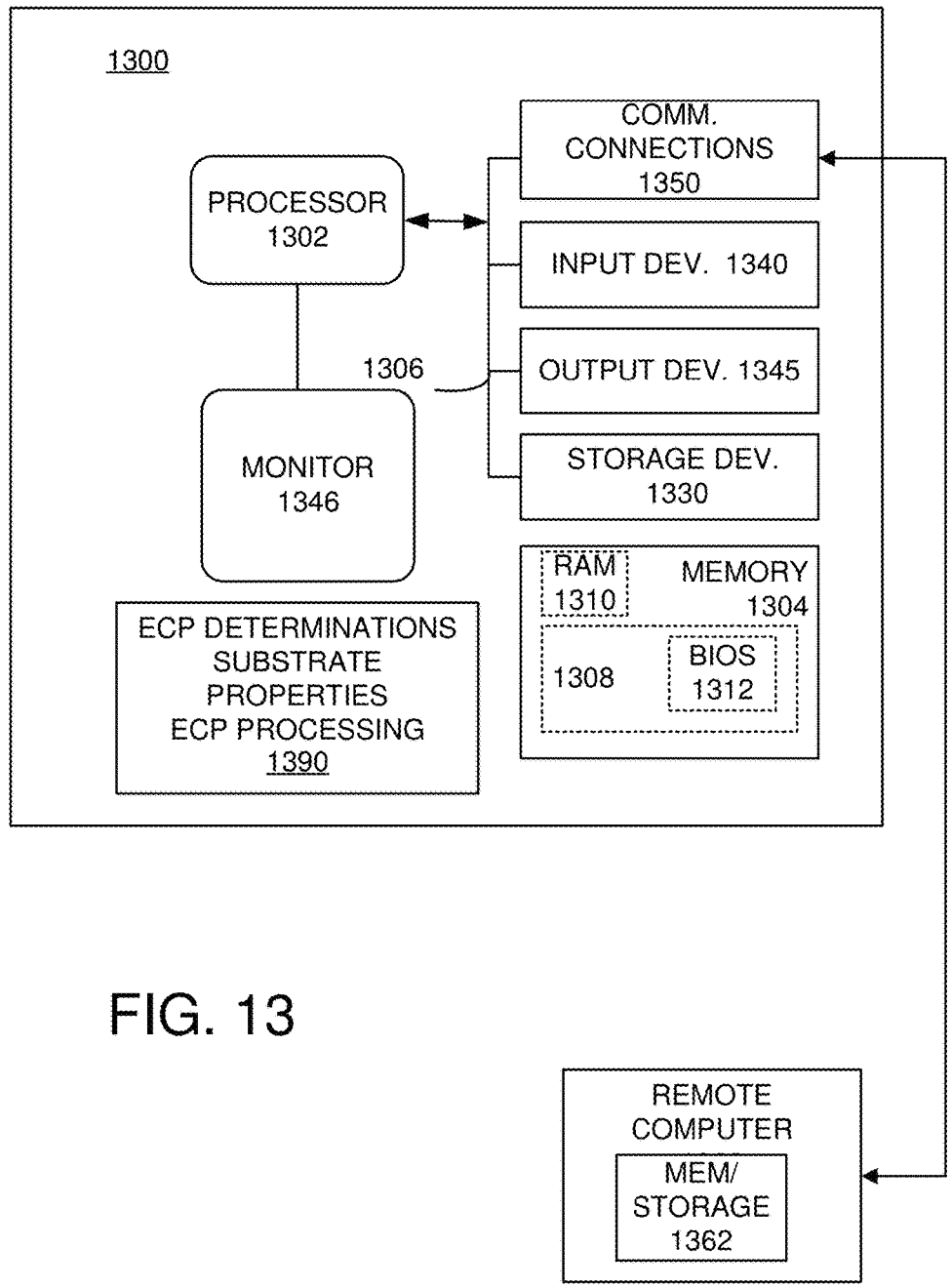
FIG. 13 illustrates a representative computing environment for control and computation.
Figure 14:
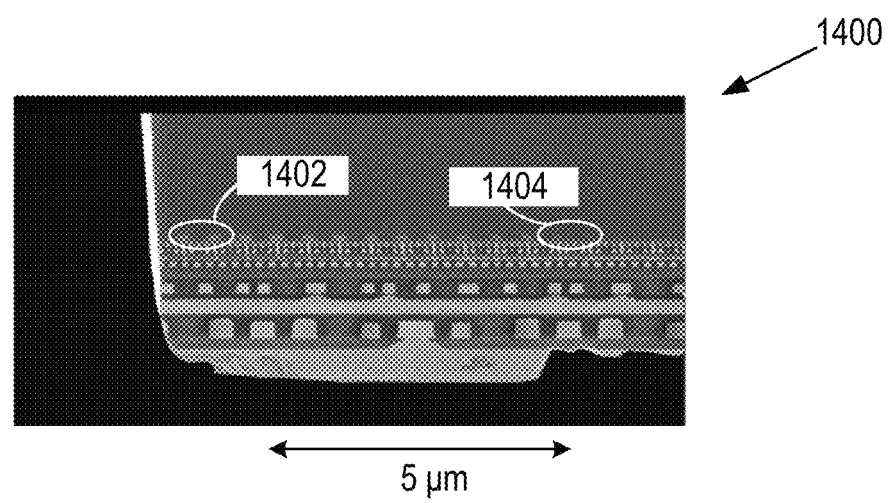
FIG. 14 is an image of an ion beam milled specimen chunk, illustrating uneven milling of circuit features due to misalignment of the specimen chunk with respect to the ion beam axis.

FIG. 13 and the following discussion are intended to provide a brief, general description of an exemplary computing environment in which the disclosed technology may be implemented. In particular, some or all portions of this computing environment can be used with the above methods and apparatus. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 13, an exemplary system for implementing the disclosed technology includes a general purpose computing device in the form of an exemplary conventional PC 1300, including one or more processing units 1302, a system memory 1304, and a system bus 1306 that couples various system components including the system memory 1304 to the one or more processing units 1302. The system bus 1306 may be any of several types of bus structures including a memory bus or memory controller, a peripheral bus, and a local bus using any of a variety of bus architectures. The exemplary system memory 1304 includes read only memory (ROM) 1308 and random access memory (RAM) 1310. A basic input/output system (BIOS) 1312, containing the basic routines that help with the transfer of information between elements within the PC 1300, is stored in ROM 1308.

The exemplary PC 1300 further includes one or more storage devices 1330 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 1306 by a hard disk drive interface, a magnetic disk drive interface, and an optical drive interface, respectively. The drives and their associated computer readable media provide nonvolatile storage of computer-readable instructions, data structures, program modules, and other data for the PC 1300. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 1330 including an operating system, one or more application programs, other program modules, and program data. A user may enter commands and information into the PC 1300 through one or more input devices 1340 such as a keyboard and a pointing device such as a mouse. For example, the user may enter commands to vary chunk tilts or select portions of an ECP for substrate alignment. Other input devices may include a digital camera, microphone, joystick, game pad, satellite dish, scanner, or the like. These and other input devices are often connected to the one or more processing units 1302 through a serial port interface that is coupled to the system bus 1306, but may be connected by other interfaces such as a parallel port, game port, or universal serial bus (USB). A monitor 1346 or other type of display device is also connected to the system bus 1306 via an interface, such as a video adapter, and can display, for example, one or more ECPs or portions thereof to permit indication of a preferred ECP portion for use in alignment. Other peripheral output devices, such as speakers and printers (not shown), may be included.

The PC 1300 may operate in a networked environment using logical connections to one or more remote computers, such as a remote computer 1360. In some examples, one or more network or communication connections 1350 are included. The remote computer 1360 may be another PC, a server, a router, a network PC, or a peer device or other common network node, and typically includes many or all of the elements described above relative to the PC 1300, although only a memory storage device 1362 has been illustrated in FIG. 13. The personal computer 1300 and/or the remote computer 1360 can be connected to a logical a local area network (LAN) and a wide area network (WAN). Such networking environments are commonplace in offices, enterprise wide computer networks, intranets, and the Internet.

As shown in FIG. 13, a memory 1390 (or portions of this or other memory) store processor executable instructions for acquisition of backscatter versus tilt angles, ECP processing such as finding a maximum backscatter or a maximum backscatter slope or other processing of backscatter data, controlling substrate tilt angles, beam angles, and beam currents. In addition, specimen characteristics such as crystal class and crystalline orientation in the substrate can be stored so that a suitable ECP or other backscatter pattern for a specific substrate and orientation can be selected.

In view of the many possible embodiments to which the principles of the disclosed technology may be applied, it should be recognized that the illustrated embodiments are only representative examples and should not be taken as limiting the scope of the disclosure. We claim all that comes within the scope and spirit of the appended claims.

We claim:

1. A method, comprising:
    directing an electron beam to a substrate at a plurality of angles of incidence and detecting portions of the electron beam returned from the substrate;
    producing, based on the detected portions of the electron beam and the plurality of angles, an electron backscatter pattern; and
    aligning the substrate with respect to an ion beam axis based on the electron backscatter pattern.

2. The method of claim 1, wherein the substrate is aligned with the ion beam axis by applying a tilt to the substrate.

3. The method of claim 1, wherein the substrate is aligned with the ion beam axis by adjusting the ion beam axis.

4. The method of claim 1, wherein the substrate is aligned with the ion beam axis by applying a tilt to the substrate and adjusting the ion beam axis.

5. The method of claim 1, wherein the substrate is aligned with respect to the ion beam axis so that a substrate surface facing the ion beam axis is perpendicular to the ion beam axis.

6. The method of claim 1, wherein the substrate is aligned based on a maximum or minimum in the electron channeling pattern.

7. The method of claim 6, wherein the substrate is secured to a tilt stage and the electron beam is directed to the substrate at the plurality of angles of incidence by varying a substrate tilt with the tilt stage.

8. The method of claim 6, wherein the electron beam is directed to the substrate at the plurality of angles of incidence by varying an axis of the electron beam.

9. The method of claim 1, further comprising ion beam milling the aligned substrate.

10. An apparatus, comprising:
a tilt stage;
a specimen mount coupled to the tilt stage and situated to secure a specimen;
an electron beam source situated to direct an electron beam to the specimen;
an electron beam detector situated to receive portions of the electron beam backscattered from the specimen; and
a controller coupled to at least one of the tilt stage or the electron beam source so as to:
vary an angle of incidence of the electron beam with respect to the specimen,
process the detected portions of the electron beam to produce an electron channeling pattern, and
determine a tilt of the specimen based on the electron channeling pattern.

11. The apparatus of claim 10, further comprising an ion beam source, wherein the controller is further configured to adjust at least one of an ion beam axis and a specimen tilt based on the determined specimen tilt.

12. The apparatus of claim 10, wherein the ion beam source includes an ion beam deflector, wherein the specimen tilt with respect to the ion beam is adjusted based on a beam deflection of the ion beam.

13. The apparatus of claim 10, wherein the controller is coupled to the tilt stage to align a substrate surface to be perpendicular to the ion beam axis.

14. The apparatus of claim 10, wherein the controller is coupled to the tilt stage to vary a specimen tilt about two orthogonal axes and receive signals associated with the corresponding backscattered portions of the electron beam.

15. The apparatus of claim 14, wherein the ion beam source is a focused ion beam source.

16. The apparatus of claim 10, wherein the controller determines the tilt of the specimen based on a portion of the electron channeling pattern as a function of a tilt angle about a single axis.

17. The apparatus of claim 10, wherein the controller determines the tilt of the specimen based on a portion of the electron channeling pattern as a function of a tilt angle about two axes.

18. The apparatus of claim 16, wherein the controller determines the tilt of the specimen based on a maximum backscattered electron beam intensity in the single axis portion of the electron channeling pattern.

19. One or more computer readable media having defined therein processor-executable instructions for performing a method comprising:
directing an electron beam to a substrate so as to be incident to the substrate at a plurality of plurality of angles of incidence and obtaining associated backscattered electron beam intensities;
processing the backscattered electron beam intensities to produce an electron channeling pattern (ECP); and
based on the ECP, aligning the substrate with respect to an ion beam axis.

20. The one or more computer readable media of claim 19, wherein the method further comprising controlling an ion beam source to direct an ion beam along the ion beam axis to thin the aligned substrate.

* * * * *